(12) United States Patent
Derksen

(10) Patent No.: US 6,914,491 B2
(45) Date of Patent: Jul. 5, 2005

(54) CONTROLLING AN OSCILLATOR OR A PHASE-DELAY DEVICE IN A PHASE-CONTROL CIRCUIT

(75) Inventor: Sven Derksen, Villach (AT)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/417,651

(22) Filed: Apr. 17, 2003

(65) Prior Publication Data

US 2004/0036540 A1 Feb. 26, 2004

(30) Foreign Application Priority Data

Apr. 22, 2002 (DE) .......................... 102 17 852

(51) Int. Cl.[7] .......................... H03L 7/085; H03L 7/18
(52) U.S. Cl. .......................... 331/17; 331/16; 331/25; 327/156; 327/157
(58) Field of Search .......................... 331/1 A, 16–18, 331/25; 327/156–159; 332/127; 360/51; 375/376; 455/260

(56) References Cited

U.S. PATENT DOCUMENTS

| | | | |
|---|---|---|---|
| 3,882,412 A | * 5/1975 | Apple, Jr. .................. | 331/1 A |
| 4,387,348 A | * 6/1983 | Fritze .......................... | 331/17 |
| 5,121,085 A | 6/1992 | Brown | |
| 5,495,512 A | 2/1996 | Kovacs et al. | |
| 5,504,459 A | 4/1996 | Gersbach et al. | |
| 6,329,883 B1 | 12/2001 | Pacourek | |

* cited by examiner

Primary Examiner—David Mis
(74) Attorney, Agent, or Firm—Jagtiani + Guttag

(57) ABSTRACT

In a phase control loop, an output signal which is used to control an oscillator in a PLL or a phase-delay device in a DLL is generated by means of a phase/frequency detector. In accordance with the invention, the oscillator or the phase-delay device is controlled by means of a control signal which is made up of a controlling component and an adjusting component. The controlling component is generated as a proportional function of the output signal, whereas the adjusting component is generated as a proportional function of the low-pass-filtered output signal. At low frequencies, the loop gain is higher in this case for generating the adjusting component than for generating the controlling component, which means that the output signal and the component parts through which it passes can be operated at their optimum operating point, at the centre of the range of variation for example. The adjusting component may be generated by both analog and digital procedures.

34 Claims, 3 Drawing Sheets

CONTROLLING AN OSCILLATOR OR A PHASE-DELAY DEVICE IN A PHASE-CONTROL CIRCUIT

BACKGROUND OF THE INVENTION

1. Field of the Invention

The present invention relates generally to controlling an oscillator or a phase-delay device, and, more particularly, to controlling such devices in a phase control circuit.

2. Related Art

Phase control circuits are used to generate signals which bear a given frequency or phase relationship to a reference signal. A signal of this kind may, for example, be generated by dividing the output signal of an oscillator in a given ratio of division, in which case it can be arranged in this way that the frequency of the output signal from the oscillator is a multiple of the frequency of the reference signal, which multiple depends on the ratio of division selected. In communications technology for example, this can be employed to allow a plurality of stable frequencies to be generated for different transmission channels with the help of only one, or a few, reference frequencies.

It is also possible for what is controlled in a phase control circuit to be not an oscillator but a phase-delay device, to which a signal is applied which is of the same frequency as the reference signal. The output signal from the phase-delay device then forms the controlling signal, in which case a signal which bears a given phase relationship to the reference signal can be generated in this way by means of the phase control circuit when for example fixed time lags are required in circuits.

A known phase control circuit of this kind is shown in FIG. 5. In this phase control circuit, a phase detector 3, which may also be a phase/frequency detector, compares the phases of a reference signal 21 and a controlling signal 22. The phase detector 3 generates a signal which controls current sources within a charge pump 4. The charge pump 4 generates two signals 5, 6 which together form a differential output signal which is applied to a loop filter 7. At the output of the loop filter 7 there is a differential output signal 8 which is connected to a control means 9 in which a control signal 18 to control an oscillator 1 is generated as a function of the output signal B. The output signal from the oscillator 1 is divided down by a divider 2, which may in particular be adjustable, to generate the controlling signal 22. With the phase control circuit settled to a steady state, the frequency of the reference signal 21 is the same as the frequency of the controlling signal 22, which means that the output frequency of the oscillator 1, divided by the ratio of division of the divider 2, is precisely the frequency of the reference signal 21. The phase control circuit shown in FIG. 5 is used to generate a specific frequency and is therefore provided with an oscillator 1 having a downstream divider 2. Alternatively, there may be provided in place of the oscillator 1 a phase-delay device to which a signal of the same frequency as the. reference signal 21 is applied and whose output signal directly represents the controlling signal 22. There is no divider in this case. In an arrangement of this kind having a phase-delay device, the phase control circuit is used to generate a signal which has a defined phase lag relative to the reference signal 21.

To obtain a desired output frequency from an oscillator 1 or a desired phase lag from a phase-delay device, a given control signal 18 is required. To enable the phase control circuit to be operated at a large number of different operating points, provision is made in the control means 9 for the signal 18 to be generated by adding an adjusting component 20 to a controlling component 19, with the controlling component 19 being generated as a function of the output signal 8 and the adjusting component 20 representing a manually adjustable offset or direct component for the control signal 18. Hence, it is known for there to be provided in the control means 9 a current or voltage source 13 by which the adjusting component 20 can be adjusted to suit the relevant requirements to be met by the phase control circuit. It is a disadvantage that this makes it necessary for the phase control circuit to be specifically adjusted to suit the particular purpose for which it is being used. Also, the adjustment by means of the current or voltage source 13 may under certain circumstances have to be changed if there is a change in the operating point of the phase control circuit.

SUMMARY OF THE INVENTION

The present invention is directed to providing a method or an arrangement for controlling an oscillator or a phase-delay device in a phase control circuit which is capable of universal use even at different operating points.

In one embodiment of the present invention, a method for controlling an oscillator or phase-delay device in a phase control circuit is disclosed. The method comprises determining a phase difference between a reference signal and a controlling signal, generating a control signal to control the device as a function of the determined phase difference, and generating an output signal as a function of the determined phase difference and the control signal. The step of generating the control signal comprises generating a controlling signal component as a function of the output signal, generating an adjusting signal component as a function of the output signal, aid adding the controlling and adjusting signal components signal to generate the control signal.

In another embodiment of the present invention, a control means for generating a control signal to control an oscillator or a phase-delay device in a phase control circuit is disclosed. The control means is so arranged that it generates the control signal as a function of an output signal which indicates a phase lag between a reference signal and a controlling signal. The control means has a low-pass filter to which the output signal is applied, and is so arranged that it generates a controlling signal component as a function of the output signal, and an adjusting signal component as a function of the output signal from the low-pass filter. The control signal is formed by an addition of the adjusting component to the controlling component.

BRIEF DESCRIPTION OF THE DRAWINGS

The invention will be explained in detail below by reference to preferred embodiments and to the accompanying drawings, in which.

DETAILED DESCRIPTION

Figure 1:
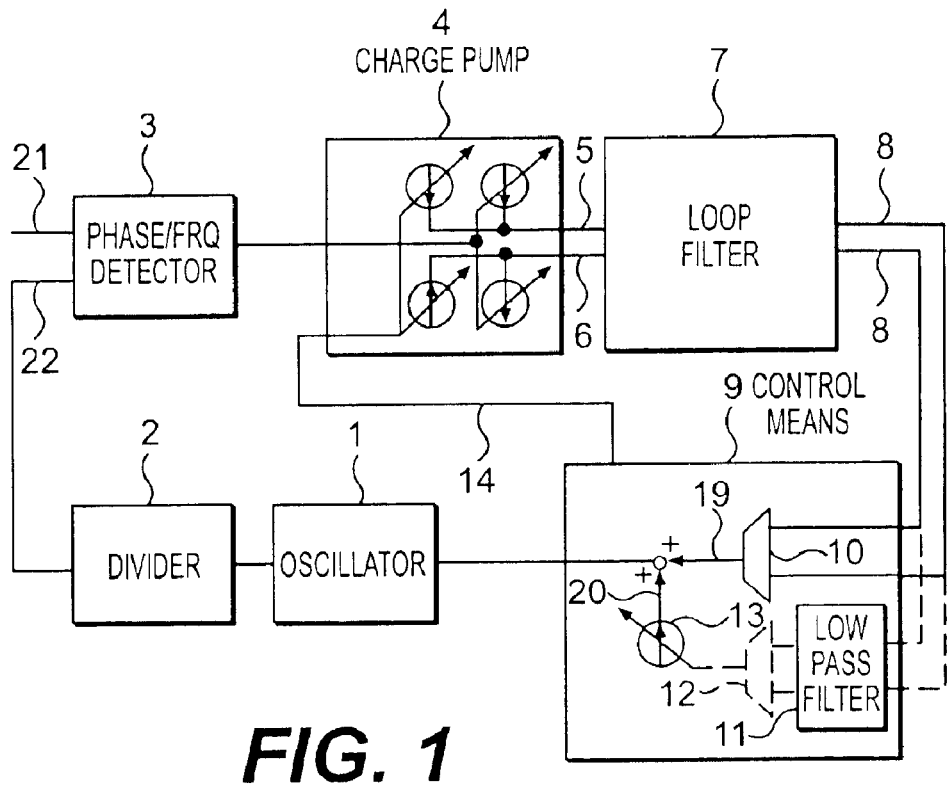
FIG. 1 shows a first embodiment of a phase control circuit according to the present invention having a control means for controlling an oscillator.

In accordance with one embodiment of the invention, a control signal for controlling an oscillator or a phase-delay means in a phase control circuit is obtained by a linear combination of a controlling component and an adjusting component. The two components are obtained as a function of an output signal which is generated as a function of a phase lag between a reference signal and a controlling signal. In one embodiment the controlling component may be generated as a proportional function of the output signal, and the adjusting component may be generated as a proportional function of the low-pass-filtered output signal. In such an embodiment, the adjusting component performs the same function as the offset or direct component which is applied in the prior art and makes it possible for universal use to be made of the phase control circuit. At low frequencies, the adjusting component is advantageously higher than the controlling component for a given output signal, whereas at higher frequencies it is the controlling component that is higher for a given output signal. In this way it is possible to compensate for slow changes in the output signal Such changes, for example, may occur when there is a change in the operating point of the phase control circuit or when it is used for a different purpose. The compensation is provided by the adjusting component, while the normal dynamic performance is maintained by means of the controlling component.

By making the division into a controlling component and an adjusting component it is possible to produce two control circuits which can be of different designs. In this way, the slow adjusting component may be designed to have a high loop gain, to enable the controlling component always to be kept in the optimum operating region without the phase control circuit becoming unstable due to too high a gain. This is because the adjusting component has a low-pass characteristic and only comes into action when there are slow changes in the output signal or in other words at lower frequencies. The output signal may be single-ended or differential; it also being of no importance whether the output signal is a current signal or a voltage signal The control signal may likewise be a current signal or a voltage signal, in which case the controlled oscillator or the controlled phase-delay device must have a corresponding current or voltage input.

The output signal is generated on the basis of a phase detector for determining the phase difference between the reference signal and the controlling signal. There may also be a charge pump provided which is controlled by the phase detector and generates a signal in proportion to the phase difference, which signal may likewise be single-ended or differential. The output signal from the charge pump also advantageously passes through a loop filter having in particular a low-pass characteristic, which filter may for example have a P-component and/or an I-component. What finally becomes available at the output of the loop filter is the output signal which is used to generate the controlling component and the adjusting component.

If the output signal is differential, the direct component of the output signal can be determined and a correcting signal generated as a function thereof to change the direct component of the output signal and in particular to keep it in an optimum operating region. This region may for example be symmetrically situated relative to a zero point of the current or voltage supply.

The loop filter preferably has a low-pass characteristic whose 3 dB corner frequency is equal to or less than 0.1 times the frequency of the reference signal. What this means is that the control circuit that is closed via the controlling component already has a low-pass characteristic. Relative to this corner frequency, the low-pass characteristic for generating the adjusting component is made appreciably lower again. The −3 dB corner frequency of the low-pass filtering to generate the adjusting component is preferably equal to or less than 0.1 times the corner frequency for the controlling component or 0.01 to 0.001 times the frequency of the reference signal.

In an advantageous refinement, the generation of the adjusting component may also be performed digitally. In this embodiment, an analog-to-digital converter is used to digitize the output signal, and a digital data-processing means is used for low-pass filtering of the digitized output signal. Also, a digital-to-analog converter which receives from the digital data-processing means the low-pass-filtered digital output signal, and generates the adjusting component. The adjusting component can be added to the controlling component in a known way in analog form.

To digitize the output signal, it is, advantageously, sufficient for a comparator to be used whose output signal need have only two states. Where the output signal is differential, the two inputs of the comparator are connected to the two lines which carry the differential output signal, which means that the comparator merely detects the polarity of the differential output signal. Where the output signal is single-ended, the comparator compares the output signal with a fixed voltage within the circuit.

Over a long time-scale, the adjusting component is set by the digital data-processing means, using the downstream digital-to-analog converter, in such a way that the output signal varies in a range which surrounds the changeover point of the comparator. With a differential output signal, this means that the output signal normally varies substantially in the range around a difference of zero.

With a differential output signal, the direct component is preferably determined and a correcting signal, which is used to shift the direct component of the output signal, is generated as a function of it. The correcting signal preferably acts on the part of the circuit which is the first to generate a differential output signal. This may, for example, be the charge pump, in which a signal to reduce the phase difference or a signal to increase the phase difference is generated as a function of the output signal from a phase detector by means of two switched current sources. To allow the direct component to be changed, there may be provided two additional voltage sources to which the correcting signal is applied.

The phase control circuit shown in FIG. 1 comprises a current-controlled oscillator 1, having a downstream divider 2 at whose output there is a controlling signal 22. Also provided is a phase/frequency detector 3 to which the controlling signal 22 on the one hand and a reference signal 21 on the other are applied. The output signal from the phase/frequency detector 3 goes to a charge pump 4 which has, internally, four switched or controllable current sources. The charge pump 4 generates, as a function of the phase difference between the controlling signal 22 and the reference signal 21, a signal S and a signal 6 which together form a difference signal for reducing or increasing the phase difference. The two output signals 5, 6 from the charge pump are applied to a loop filter 7 which has a low-pass filter having a corner frequency which is equal to or less than 0.1 times the frequency of the reference signal 21. The loop filter 7 produces at its output the output signal 8, which is present in differential form and which is applied to a control means 9. As a function of the output signal 8, the control means 9 generates a control signal 18 to control the oscillator 1. At the same time, the control means also generates as a function of the output signal 8 a correcting signal 14 which acts on the charge pump 4 and is used to keep the direct component of the differential output signal 8 within a desired range.

The control means 9 has a difference amplifier 10 which, as a function of the differential output signal 8, or in other words of the difference between the two lines carrying the differential output signal 8, generates a current signal which forms the controlling component 19. As well as this, the control means 9 has a low-pass filter 11, to which the output signal 8 is applied and to whose output a second difference amplifier 12 is connected. As a function of the low-pass-filtered output signal 8, the second difference amplifier 12 generates a current signal which forms the adjusting component 20. For this purpose, the difference amplifier 12 controls a current source 13, although the difference amplifier 12 may directly have a current output. The controlling component 19 and the adjusting component 20 are summed, for which purpose, in the case of current signals, a simple node is all that is needed to bring the two currents together. The summed signal formed from the controlling component 19 and the adjusting component 20 finally constitutes the control signal 18 which, in the form of a current signal, controls the oscillator 1.

The control means 9 further has a component part (rot shown) which can be used to determine the direct component of the output signal 8 and to generate the correcting signal 14 as a function thereof.

The second difference amplifier 12 is of substantially higher gain than the first difference amplifier 10, which means that in the settled state, the major proportion of the control signal 18 is formed by the adjusting component 20. The controlling component 19 may therefore be very small, which means that only a small output signal 8 is required. What this means is that the output signals 5, 6 from the charge pump 4, the input and output signals to and from the loop filter 7, the output signal 8 and the first difference amplifier 10 can be operated at an optimum operating point.

Figure 2:
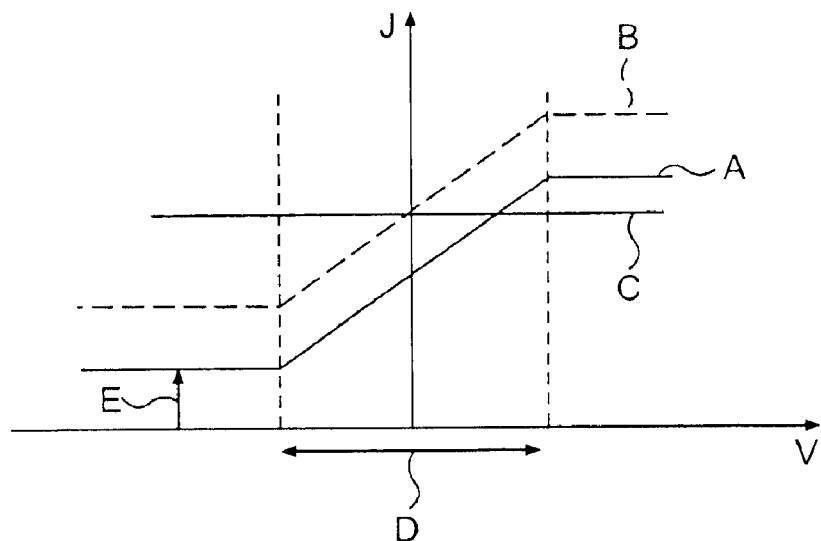
FIG. 2 shows the response characteristic of a control means for controlling an oscillator in the first embodiment of phase control circuit according to the invention.

In FIG. 2 the way in which the present invention operates is clearly shown. Plotted along the horizontal axis in this case is the difference voltage between the two lines carrying the differential output signal 8, whereas the control signal 18 is plotted along the vertical axis. Line C is the value for the control current or control signal 18 which is required to obtain the desired output frequency from the oscillator 1 in the settled state. Curve A represents the curve followed by the control signal 18 in relation to the output signal 8 if there were no action exerted by the adjusting component 20, as would be the case in for example a conventional phase control circuit.

As can be seen from the graph in FIG. 2, the output signal 8 has to rise to a high value to reach the requisite control current C. The point of intersection of the straight horizontal line representing the control current C and curve A represents the operating point of the circuit. Shown below the horizontal axis is the range of variation D of the output signal 8. The operating point which is set to in the case of curve A is situated close to the right-hand edge of the range of variation D for the output signal 8, which means that the control characteristics of the phase control circuit are degraded and it is hardly possible for any further increase to take place in the control signal 18 or in the frequency from the oscillator 1. In the graph shown in FIG. 2, the voltage E represents a direct component which is allowed for as a basic requirement and which preferably corresponds to a minimum control current for controlling the oscillator 1.

Curve B for the control signal 18 is obtained with the help of the adjusting component 20. As a result of the high gain of the second difference amplifier 12, the curve for the control signal 18 is raised until the output signal 8 can be reduced sufficiently far to allow it to be located substantially in the centre of its range of variation D. What this means is that the operating point is always situated in the centre of the range of variation D for the output voltage 8 largely irrespective of the desired frequency from the oscillator 1. What this means is a better control response and a wider range of application for the phase control circuit.

Figure 3:
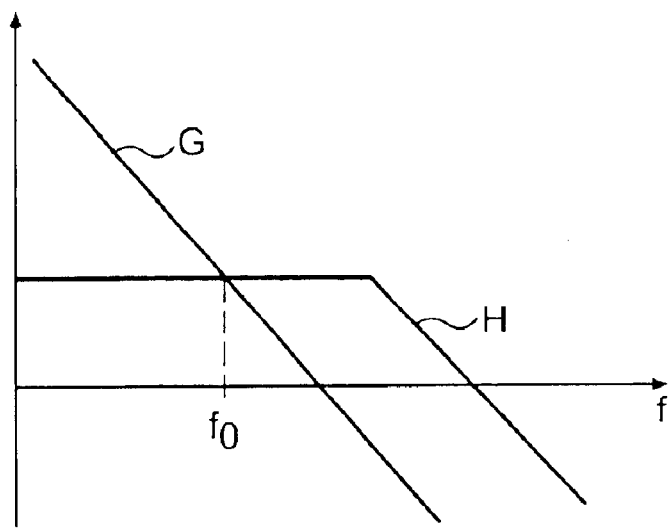
FIG. 3 shows the loop gains of the controlling component and the adjusting component, plotted against frequency, in the first embodiment of phase control circuit according to the present invention.

The two paths, via the controlling component 19 and the adjusting component 20 respectively, represent two control circuits which can be separated from one another and which have different response characteristics. In FIG. 3, the loop gain of the two control circuits is plotted against frequency, the frequency being that of the output signal 8. Curve G represents the behaviour of the adjusting component 20 in this case, whereas curve H represents the behaviour of the controlling component 19. As can be seen from the graph in FIG. 3, at low frequencies the loop gain for the adjusting component 20 is substantially higher than for the controlling component 19. The loop gain for the adjusting component declines as frequency rises, until, at a frequency $f_o$, the controlling component 19 and the adjusting component 20 become equal for a given output signal 8. Above this frequency $f_o$, the adjusting component 20 is smaller. The curve H for loop gain for the controlling component 19 also contains a kink but this is situated at a frequency considerably higher than frequency $f_o$. The reason for it is the loop filter 7, which has a low-pass characteristic with a corner frequency which is approximately equal to one tenth or less of the frequency of the reference signal 21 in order to give the phase control circuit a stable control response.

Figure 4:
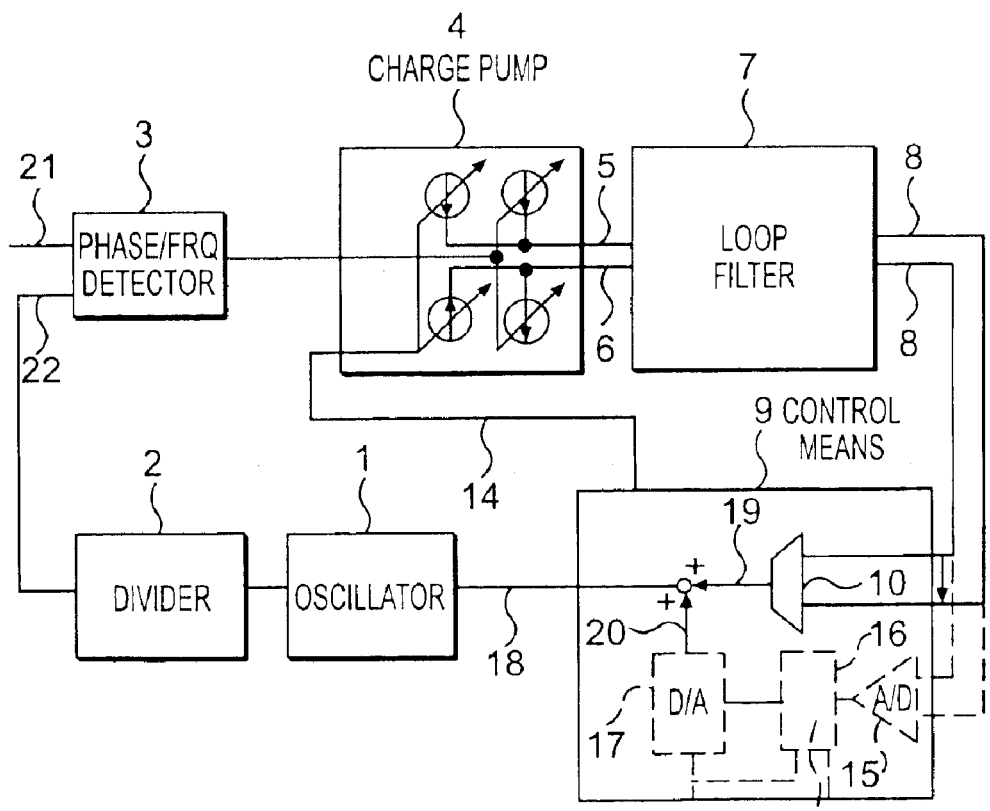
FIG. 4 shows a second embodiment of phase control circuit according to the present invention have a control means for controlling the oscillator.
Figure 5:
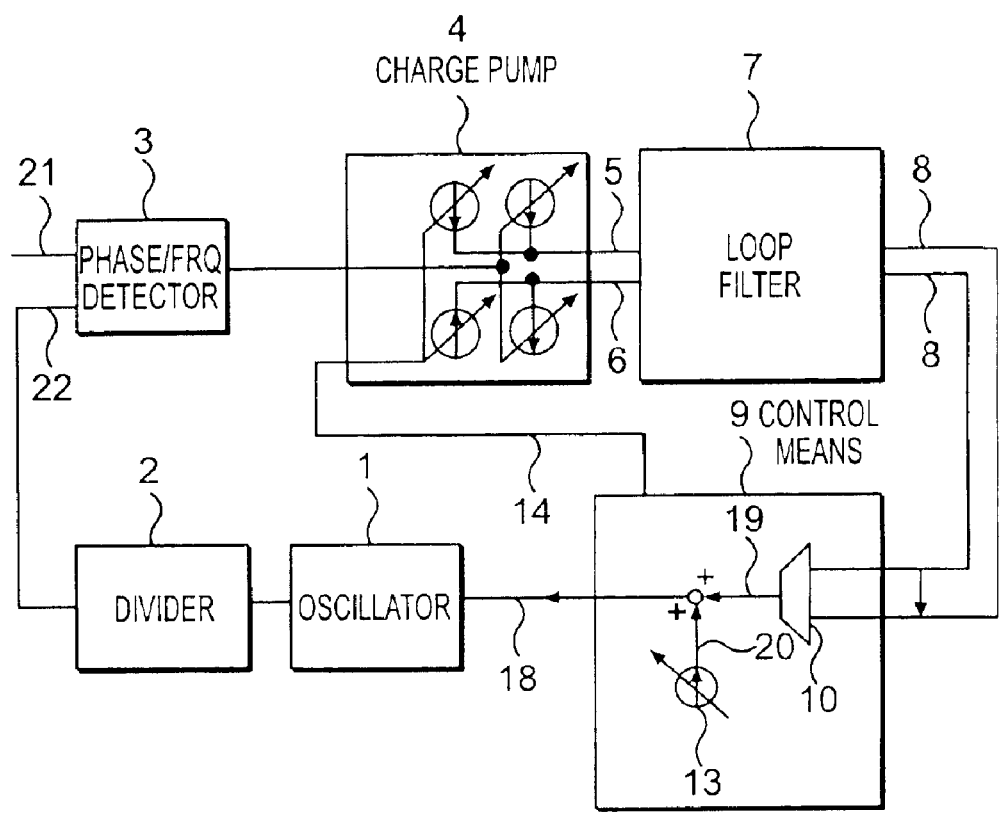
FIG. 5 shows a prior-art phase control circuit.

Shown in FIG. 4 is a second embodiment of the present invention. The only difference from the first embodiment is the design of the control means 9. In the second embodiment the adjusting component 20 is generated digitally. For this purpose, the control means 9 has an analog-to-digital converter 15 for digitizing the output signal 8. The output from the analog-to-digital converter 15 is detected by a digital data-processing means 16 and low-pass filtered. The result of the low-pass filtering is passed on in turn to a digital-to-analog converter 17 having a current output, from whose output the adjusting component 20 becomes available.

As in the first embodiment of the present invention, the output signal 8 is also applied to a first difference amplifier 10 having a current output from which the controlling component 19 becomes available. As before, the control signal 18 is generated in the control means 9 by adding or combining the adjusting component 20 to or with the controlling component 19. The control signal 18 is applied in a known manner to the oscillator 1.

In the present embodiment, the analog-to-digital converter 15 is a single comparator but it may also be of higher resolution. In the control means 9, the adjusting signal 20 is generated in such a way that the differential output signal 8 is substantially zero or the comparator 15 is operated in a region in which it switches to and for between its two switched states.

By means of the present invention, the control response of a phase control circuit is improved and the circuit is made considerably easier to use, at very little cost or complication, because no setting is required to obtain the operating point, or to achieve the purpose, which is actually being aimed for.

While various embodiments of the present invention have been described above, it should be understood that they have been presented by way of example only, and not limitation. For example, the phase-delay device disclosed in the above description can be implemented in hardware, software, or any combination thereof. Thus, the breadth and scope of the present invention should not be limited by any of the above described exemplary embodiments, but should be defined only in accordance with the following claims and their equivalents.

What is claimed is:

1. A method for controlling an oscillator or phase-delay device in a phase control circuit comprising:
   determining a phase difference between a reference signal and a controlling signal;
   generating a control signal to control the device as a function of the determined phase difference; and
   generating an output signal as a function of the determined phase difference,
   wherein generating the control signal comprises:
   generating a control signal component as a function of said output signal,
   low-pass filtering the output signal to generate a low-pass filtered output signal,
   generating an adjusting signal component as a function of the low-pass filtered output signal, and
   adding the control signal component and the adjusting signal component to generate the control signal.

2. The method of claim 1, wherein the output signal is a voltage signal.

3. The method of claim 1, wherein the control signal is a voltage signal.

4. The method of claim 1, wherein the control signal is a current signal.

5. The method of claim 1, wherein, for frequencies of the output signal which are below a limiting frequency, the adjusting signal component is larger than the control signal component, and for frequencies of the output signal which are above a limiting frequency, the control signal component is larger than the adjusting signal component.

6. The method of claim 1, wherein the output signal is an output signal from a loop filter.

7. The method of claim 6, wherein the loop filter applies low-pass filtering having a corner frequency which is equal to or less than 0.1 times the frequency of the reference signal.

8. The method of claim 7, wherein the corner frequency of the low-pass filtering applied to the output signal to generate the adjusting signal component is equal to or less than 0.01 to 0.001 times the frequency of the reference signal.

9. The method of claim 7, wherein the corner frequency of the low-pass filtering applied to the output signal to generate the adjusting component is equal to or less than 0.01 times the corner frequency of the low-pass filtering in the loop filter.

10. The method of claim 1, wherein the output signal is a differential signal.

11. The method of claim 10, wherein a correcting signal for shifting the direct component of the output signal is generated as a function of the direct component of the output signal.

12. The method of claim 1, wherein the low-pass filtering of the output signal and the generation of the adjusting signal component are performed digitally.

13. A control means for generating a control signal to control an oscillator or a phase-delay device in a phase control circuit, the control means being so arranged that it generates the control signal as a function of an output signal which indicates a phase lag between a reference signal and a controlling signal, wherein the control means has a low-pass filter to which the output signal is applied, and is so arranged that it generates a control signal component as a function of the output signal, and an adjusting signal component as a function of the output signal from the low-pass filter, and the control signal is formed by an addition of the adjusting component to the controlling component.

14. The control means of claim 13, wherein the control means has an analog-to-digital converter to digitize the output signal, and a digital data-processing means for low-pass filtering of the digital output signal from the analog-to-digital converter and for controlling a digital-to-analog converter for generating the adjusting component by using an output signal from the digital low-pass filtering.

15. The control means of claim 14, wherein the analog-to-digital converter is a comparator.

16. The control means of claim 13, wherein the control means is so arranged that it determines the direct component of a differential output signal and, as a function thereof, generates a correcting signal to shift the direct component of the output signal.

17. The phase control circuit having an oscillator or a phase-delay device for generating a signal, a phase detector for determining a phase difference between the signal and a reference signal, a means for generating an output signal as a function of the phase difference determined by the phase detector, and a control means, according to claim 13, to generate a control signal for controlling the oscillator or the phase-delay device as a function of the output signal.

18. The phase control circuit of claim 17, wherein the means for generating the output signal has a charge pump.

19. The phase control circuit of claim 17, wherein the means for generating the output signal has a loop filter.

20. A method for controlling an oscillator or phase-delay device in a phase control circuit comprising:
    determining a phase difference between a reference signal and a controlling signal;
    generating a control signal to control the device as a function of the determined phase difference; and
    generating an output signal as a function of the determined phase difference,
    wherein generating the control signal comprises:
    generating a control signal component,
    generating an adjusting signal component as a function of the output signal, and
    adding the controlling component signal and the adjusting signal component to generate the control signal, wherein, for frequencies of the output signal which are below a limiting frequency, the adjusting signal component is larger than the control signal component, and for frequencies of the output signal which are above a limiting frequency, the control signal component is larger than the adjusting signal component.

21. The method of claim 20, wherein the output signal is a voltage signal.

22. The method of claim 20, wherein the control signal is a voltage signal.

23. The method of claim 20, wherein the control signal is a current signal.

24. The method of claim 20, wherein the output signal is an output signal from a loop filter.

25. The method of claim 24, wherein the loop filter applies low-pass filtering having a corner frequency which is equal to or less than 0.1 times the frequency of the reference signal.

26. The method of claim 25, wherein the corner frequency of the low-pass filtering applied to the output signal to generate the adjusting signal component is equal to or less than 0.01 to 0.001 times the frequency of the reference signal.

27. The method of claim 25, wherein the corner frequency of the low-pass filtering applied to the output signal to generate the adjusting component is equal to or less than 0.01 times the corner frequency of the low-pass filtering in the loop filter.

28. The method of claim 20, wherein the output signal is a differential signal.

29. The method of claim 28, wherein a correcting signal for shifting the direct component of the output signal is generated as a function of the direct component of the output signal.

30. The method of claim 20, wherein the low-pass filtering of the output signal and the generation of the adjusting signal component are performed digitally.

31. A method for controlling an oscillator or phase-delay device in a phase control circuit comprising:
    determining a phase difference between a reference signal and a controlling signal;
    generating a control signal to control the device as a function of the determined phase difference; and
    generating an output signal as a function of the determined phase difference, wherein generating the control signal comprises:
    generating a control signal component as a function of said output signal,
    low-pass filtering the output signal to generate a low-pass filtered output signal,
    generating an adjusting signal component as a function of the low-pass filtered output signal, and
    adding the control signal component and the adjusting signal component to generate the control signal,
    wherein, for frequencies of the output signal which are below a limiting frequency, the adjusting signal component is larger than the control signal component, and for frequencies of the output signal which are above a limiting frequency, the control signal component is larger than the adjusting signal component.

32. A method for controlling an oscillator or phase-delay device in a phase control circuit comprising:
    determining a phase difference between a reference signal and a controlling signal;
    generating a control signal to control the device as a function of the determined phase difference; and
    generating an output signal as a function of the determined phase difference,
    wherein generating the control signal comprises:
    generating a control signal component as a function of said output signal,
    low-pass filtering the output signal to generate a low-pass filtered output signal,
    generating an adjusting signal component as a function of the low-pass filtered output signal, and
    adding the control signal component and the adjusting signal component to generate the control signal,
    wherein the output signal is an output signal from a loop filter.

33. A method for controlling an oscillator or phase-delay device in a phase control circuit comprising:
    determining a phase difference between a reference signal and a controlling signal;
    generating a control signal to control the device as a function of the determined phase difference; and
    generating an output signal as a function of the determined phase difference,
    wherein generating the control signal comprises:
    generating a control signal component as a function of said output signal,
    low-pass filtering the output signal to generate a low-pass filtered output signal,
    generating an adjusting signal component as a function of the low-pass filtered output signal, and
    adding the control signal component and the adjusting signal component to generate the control signal,
    wherein the output signal is a differential signal.

34. A method for controlling an oscillator or phase-delay device in a phase control circuit comprising:
    determining a phase difference between a reference signal and a controlling signal;
    generating a control signal to control the device as a function of the determined phase difference; and
    generating an output signal as a function of the determined phase difference,
    wherein generating the control signal comprises:
    generating a control signal component as a function of said output signal,
    low-pass filtering the output signal to generate a low-pass filtered output signal,
    generating an adjusting signal component as a function of the low-pass filtered output signal, and
    adding the control signal component and the adjusting signal component to generate the control signal,
    wherein the low-pass filtering of the output signal and the generation of the adjusting signal component are performed digitally.

* * * * *